United States Patent
Im

(10) Patent No.: US 7,176,622 B2
(45) Date of Patent: Feb. 13, 2007

(54) ORGANIC ELECTRO-LUMINESCENCE DEVICE WITH DIELECTRIC LAYER HAVING ANTIOXIDATIVE MATERIAL AND FABRICATING METHOD THEREOF

(75) Inventor: Sung Gap Im, Kyounggi-do (KR)

(73) Assignee: LG.Philips LCD., Ltd, Seoul (KR)

( * ) Notice: Subject to any disclaimer, the term of this patent is extended or adjusted under 35 U.S.C. 154(b) by 80 days.

(21) Appl. No.: 10/826,279

(22) Filed: Apr. 19, 2004

(65) Prior Publication Data

US 2005/0140284 A1  Jun. 30, 2005

(30) Foreign Application Priority Data

Dec. 30, 2003 (KR) .................. 10-2003-0100652

(51) Int. Cl.
  H01J 1/62 (2006.01)
  H01J 63/04 (2006.01)
  H01J 17/24 (2006.01)

(52) U.S. Cl. .............. 313/509; 313/504; 313/506; 313/553

(58) Field of Classification Search ........ 313/509, 313/506, 553
  See application file for complete search history.

(56) References Cited

U.S. PATENT DOCUMENTS

| | | | |
|---|---|---|---|
| 5,652,067 A * | 7/1997 | Ito et al. .................. | 313/506 |
| 6,198,217 B1 * | 3/2001 | Suzuki et al. ............. | 313/504 |
| 6,420,834 B2 * | 7/2002 | Yamazaki et al. ......... | 313/257 |
| 6,525,339 B2 * | 2/2003 | Motomatsu ............... | 257/40 |
| 6,614,175 B2 * | 9/2003 | Aziz et al. ................ | 313/504 |
| 6,642,650 B1 * | 11/2003 | Struye et al. ............. | 313/502 |
| 6,753,096 B2 * | 6/2004 | Duggal et al. ............ | 313/506 |
| 6,833,668 B1 * | 12/2004 | Yamada et al. ........... | 313/505 |
| 6,924,594 B2 * | 8/2005 | Ogura et al. .............. | 313/506 |
| 2002/0155320 A1 * | 10/2002 | Park et al. ................ | 313/512 |
| 2003/0122468 A1 * | 7/2003 | Cho et al. ................. | 313/309 |
| 2004/0195206 A1 * | 10/2004 | Hiraga et al. ............. | 216/58 |
| 2005/0023972 A1 * | 2/2005 | Lewandowski et al. ... | 313/509 |
| 2005/0206313 A1 * | 9/2005 | Yamazaki et al. ......... | 313/506 |
| 2006/0060086 A1 * | 3/2006 | Wang et al. ............... | 96/108 |

FOREIGN PATENT DOCUMENTS

JP   03022393   * 1/1991

* cited by examiner

Primary Examiner—Nimeshkumar D. Patel
Assistant Examiner—Peter Macchiarolo
(74) Attorney, Agent, or Firm—Birch, Stewart, Kolasch & Birch, LLP

(57) ABSTRACT

An organic electro-luminescence (EL) device includes a first electrode formed on a substrate and a second electrode formed to overlap with the first electrode. An organic EL layer is located between the first and second electrodes. A dielectric layer is formed between the second electrode and the EL layer. The dielectric layer contains antioxidative material, formed by a mixture of approximately 50~75% of an organic material and approximately 25~50% of an metallic powder. The organic electro-luminescence device demonstrates an increased picture quality and increased luminous efficiency.

25 Claims, 7 Drawing Sheets

ORGANIC ELECTRO-LUMINESCENCE DEVICE WITH DIELECTRIC LAYER HAVING ANTIOXIDATIVE MATERIAL AND FABRICATING METHOD THEREOF

This Nonprovisional application claims priority under 35 U.S.C. 119(a) on Patent Application No(s). 10-2003-0100652 filed in KOREA on Dec. 30, 2003, the entire contents of which are hereby incorporated by reference.

BACKGROUND OF THE INVENTION

1. Field of the Invention

The present invention relates to an organic electro-luminescence device and a fabricating method thereof. More particularly, the present invention relates to an organic electro-luminescence device and a fabricating method thereof wherein a picture quality is improved and a luminous efficiency is increased.

2. Description of the Related Art

Recently, there have been developed various flat panel displays, reduced in weight and bulk, that are capable of eliminating the disadvantages of a Cathode Ray Tube (CRT). Such flat panel displays include a Liquid Crystal Display (hereinafter referred to as a "LCD"), a Field Emission Display (FED), a Plasma Display Panel (hereinafter referred to as a "PDP") and an Electro-Luminescence (hereinafter referred to as an "EL") display, etc. There is an ongoing effort to improve the image quality of a flat panel display, and an ongoing effort to manufacture flat panel displays of larger size.

At present, a PDP has many advantages. A PDP is light weight and thin. Further, the PDP can have a large size thanks to a simple configuration and fabrication process. On the other hand, a PDP has some disadvantages, such as a low luminous efficiency, low brightness and high power consumption.

In comparison with a PDP, an active matrix LCD, using a Thin Film Transistor (hereinafter referred to as a "TFT") as a switching device, is difficult to manufacture in a large size. Also, an active matrix LCD has the disadvantage of high power consumption due to a back light unit, large optical losses owing to optical devices such as a polarizing filter, a prism sheet, a diffuser, etc., and a narrow viewing angle.

An EL device is classified into an inorganic EL device and an organic EL device according to the materials used in a light-emitting layer of the EL device. EL devices have the advantages of a fast response speed, a high luminous efficiency and brightness, and a wide viewing angle. As compared to the organic EL device, the inorganic EL device has higher power consumption, reduced brightness and does not emit various lights of R, G and B. On the other hand, the organic EL device has the advantages of lower driving voltage (e.g. reduced power consumption), a fast response speed, high brightness and light-emitting of various colors of R, G and B, such that it is suitable for a post-generation display device.

FIG. 1 is a sectional view of an EL layer of a conventional EL device, and FIG. 2 is a diagram illustrating a light-emitting principle of the conventional EL device.

The EL layer shown in FIG. 1 includes an organic light-emitting layer 10 formed between a first electrode (or an anode) 4 and a second electrode (or a cathode) 12. The organic light-emitting layer 10 includes an electron injection layer 10A, an electron carrier layer 10B, a light-emitting layer 10C, a hole carrier layer 10D and a hole injection layer 10E.

A predetermined voltage is applied between the first electrode 4 and the second electrode 12, as shown in FIG. 1. As illustrated in FIG. 2, the predetermined voltage causes electrons produced from the second electrode 12 to move, via the electron injection layer 10A and the electron carrier layer 10B, into the light-emitting layer 10C. Moreover, holes produced from the first electrode 4 move, via the hole injection layer 10E and the hole carrier layer 10D, into the light-emitting layer 10C. Thus, the electrons and the holes fed from the electron carrier layer 10B and the hole carrier layer 10D emit light upon their re-combination at the light-emitting layer 10C. The light is, emitted to the exterior via the first electrode 4 to thereby display a picture.

The hole injection layer 10E controls the concentration of holes. The hole carrier layer 10D controls the movement speed of the holes. By this arrangement, the holes produced from the first electrode 4 are easily injected into the light-emitting layer 10C.

The electron injection layer 10A controls the concentration of the electrons. The electron carrier layer 10B controls the movement speed of electrons. By this arrangement, the electrons produced from the second electrode 12 are easily injected into the light-emitting layer 10C.

The first electrode 4 is made from transparent and conductive substances such as an indium tin oxide (ITO), a tin oxide (TO) or an indium zinc oxide (IZO), or other similar substances. The first electrode 4 can be formed on a substrate and may also include Au, Pt, Cu and similar substances.

The hole injection layer 10E is formed by depositing mainly Copper (II) Phthalocyanine. In one embodiment, the hole injection layer is about 10~30 nm thick.

The hole carrier layer 10D is formed by depositing mainly N,N-di(naphthalene-1-yl)-N,N'-diphenylbenzidine (NPD). In one embodiment, the hole carrier layer is about 30~60 nm thick.

The light-emitting layer 10C mainly emits light by bringing-electrons and holes together. As occasion demands, the light-emitting layer 10C uses a light-emitting substance independently, or one doping on a host material.

In the case of emitting green (G) light, out of red (R), green (G) and blue (B) lights, the light-emitting layer 10C is formed by doping N-methylquinacridone (MQD) on the host material like tris(8-hydroxyquinolate)aluminum (Alq3). In one embodiment, the light-emitting layer is about 30~60 nm thick. Moreover, in the case of using a light-emitting substance independently, the light-emitting layer 10C is formed by doping mainly Alq3 to emit the green light.

The electron carrier layer 10B is formed by depositing metal-complex compounds, like Alp3. In one embodiment, the electron carrier layer is about 20~50 nm thick.

The electron injection layer 10A is formed by depositing alkali metallic derivatives. In one embodiment, the electron injection layer is about 30~60 μm thick.

In the case of low molecules, the hole carrier layer 10D, the hole injection layer 10E, the light-emitting layer 10C, the electron carrier layer 10B, and the electron injection layer 10A are formed by a vacuum depositing method. In the case of high molecules, the hole carrier layer 10D, the hole injection layer 10E, the light-emitting layer 10C, the electron carrier layer 10B, and the electron injection layer 10A are formed by a spin coating method or an ink-jet printing method.

The second electrode 12 can be formed by using mainly Al, Li, Ca, Mg or Ba, having low work functions. Most commonly, the second electrode 12 is formed using metals like Al. A TFT array portion may be formed or positioned in lower part of the EL layer.

A drawback of an organic EL device, as described above, is that the organic EL device is easily deteriorated. To solve such a problem, a packaging plate 20 is attached to it. The packaging plate 20 encapsulates the organic EL device, as shown in FIG. 3.

The packaging plate 20 covers the EL layer formed on the substrate 2, and prevents the EL layer from being deteriorated by moisture and oxygen in the atmosphere. Further, the packaging plate 20 emits heat generated by the light-emission of the EL layer, and removes moisture and oxygen inside of the packaging plate 20 and the substrate 2 using an absorbing material, neutralizer or getter 16, formed on the back of the packaging plate 20. By this arrangement, the packaging plate 20 protects the EL layer 10 from moisture and oxygen in the atmosphere.

Despite the encapsulation process, the problem persists that the property of the EL layer is deteriorated. The deterioration occurs because small amounts of moisture and oxygen are not completely removed. The small amount of remaining moisture and oxygen, which is not removed during the encapsulation process, gathers or concentrates, between the second electrode 12 and the organic EL layer 10. Specifically, the oxygen and the moisture gathers or concentrates in the area where the organic EL layer 10, as an organic material, and the second electrode 12, as a metal, contact each other. The two materials have abrupt differences in surface energy, as a result Al2O3 is formed by a reaction of the metallic substance of the second electrode 12, like Al and $O_2$.

The deterioration or oxide layer between the second electron 12 and the organic layer 10 restricts movement of electrons produced by the second electrode 12. Hence, the efficiency of the recombination of the holes and electrons in the light-emitting layer 10C is deteriorated. As a result, there arises a problem that a picture quality is deteriorated, due to a blurring effect, as illustrated in FIG. 4.

SUMMARY OF THE INVENTION

Accordingly, it is an object of the present invention to provide an organic electro-luminescence (EL) device and a fabricating method thereof to enhance a picture quality of a display, and to thereby increase a luminous efficiency.

In order to achieve these and other objects of the invention, an organic EL device according to embodiments of the present invention includes a first electrode formed on a substrate; a second electrode formed to overlap to the first electrode with an organic EL layer therebetween; and a dielectric layer formed between the second electrode and the EL layer, wherein the dielectric layer contains an antioxidative material. The antioxidative material can be formed of a mixture of 50~75% of an organic material and 25~50% of a metallic powder.

The organic material is at least one of a salt system compound, a $CH_3COO-$ compound, an aromatics amine system material, phenol derivatives and a phosphite system material.

The metallic powder is at least one of Al, Li, Ca, Mg and Ba, having low work function.

The dielectric layer is in a range of 10~80 Å in thickness.

The organic EL layer further includes: a hole injection layer formed on the first electrode; a light-emitting layer formed on the hole injection layer; an electron carrier layer formed on the light-emitting layer; and an electron injection layer formed on the electron carrier layer.

The material for the first electrode includes at least one of an Indium Tin Oxide (ITO), a Tin Oxide (TO) and an Indium Zinc Oxide (IZO).

A fabricating method of an organic EL device includes forming a first electrode on a substrate; forming an EL layer on the substrate having the first electrode formed thereon; forming a dielectric layer containing an antioxidative material; and forming a second electrode on the dielectric layer. In a preferred embodiment, the antioxidative layer includes a mixture of 50~75% of an organic material and 25~50% of an metallic powder.

The organic material is at least one of a salt system compound, a $CH_3COO-$ compound, an aromatics amine system material, phenol derivatives and a phosphite system material.

The metallic powder is at least one of Al, Li, Ca, Mg and Ba, having a low work function.

The step of forming the EL layer includes forming a hole injection layer on the first electrode; forming a hole carrier layer on the hole injection layer; forming a light-emitting layer on the hole carrier layer; forming an electron carrier layer on the light-emitting layer; and forming an electron injection layer on the electron carrier layer.

The dielectric layer is in a range of 10~80 Å in the thickness.

The material of the first electrode includes at least one of an Indium Tin Oxide (ITO), a Tin Oxide (TO) and an Indium Zinc Oxide (IZO).

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Hereinafter, the preferred embodiments of the present invention will be described in detail with reference to FIGS. 5 to 7.

Figure 1:
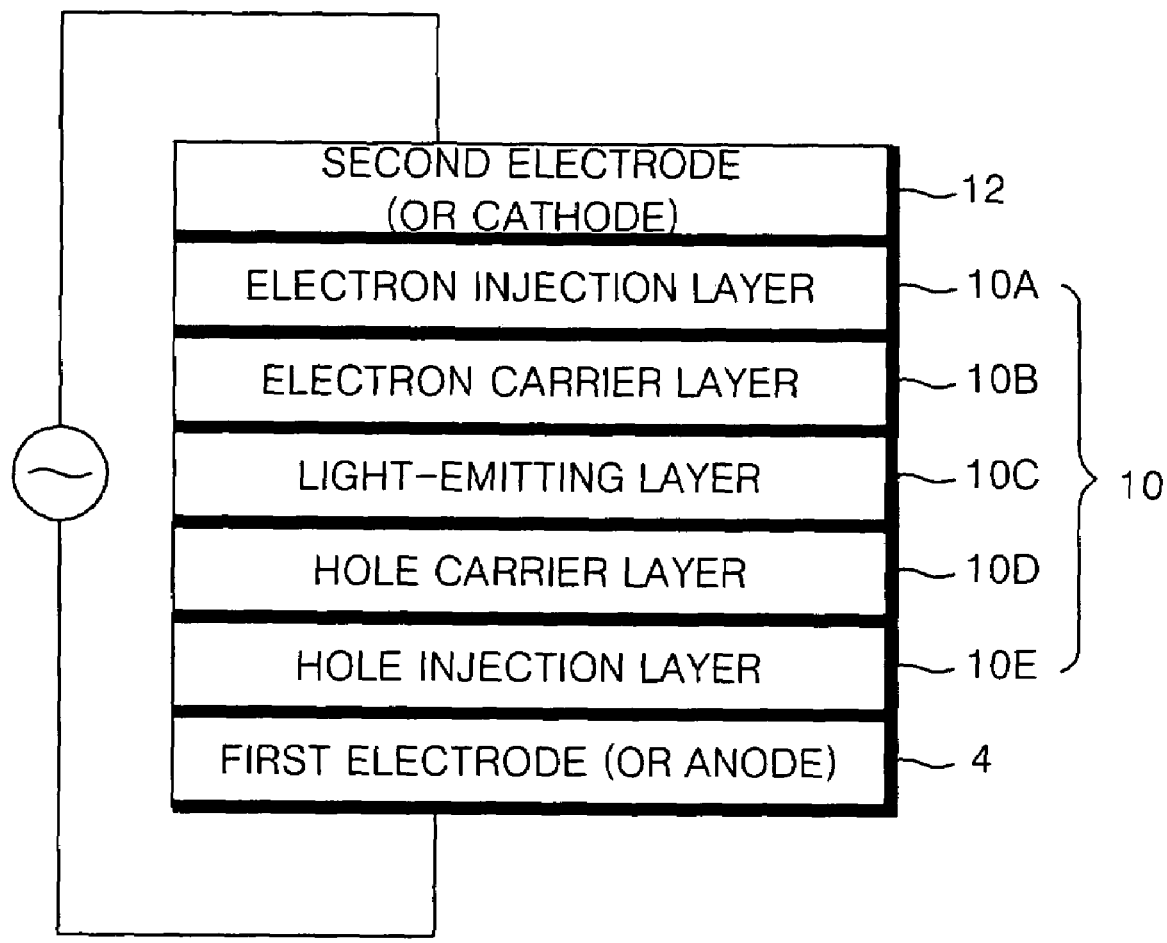
FIG. 1 is a schematic diagram representing an organic EL layer, in accordance with the background art.
Figure 2:
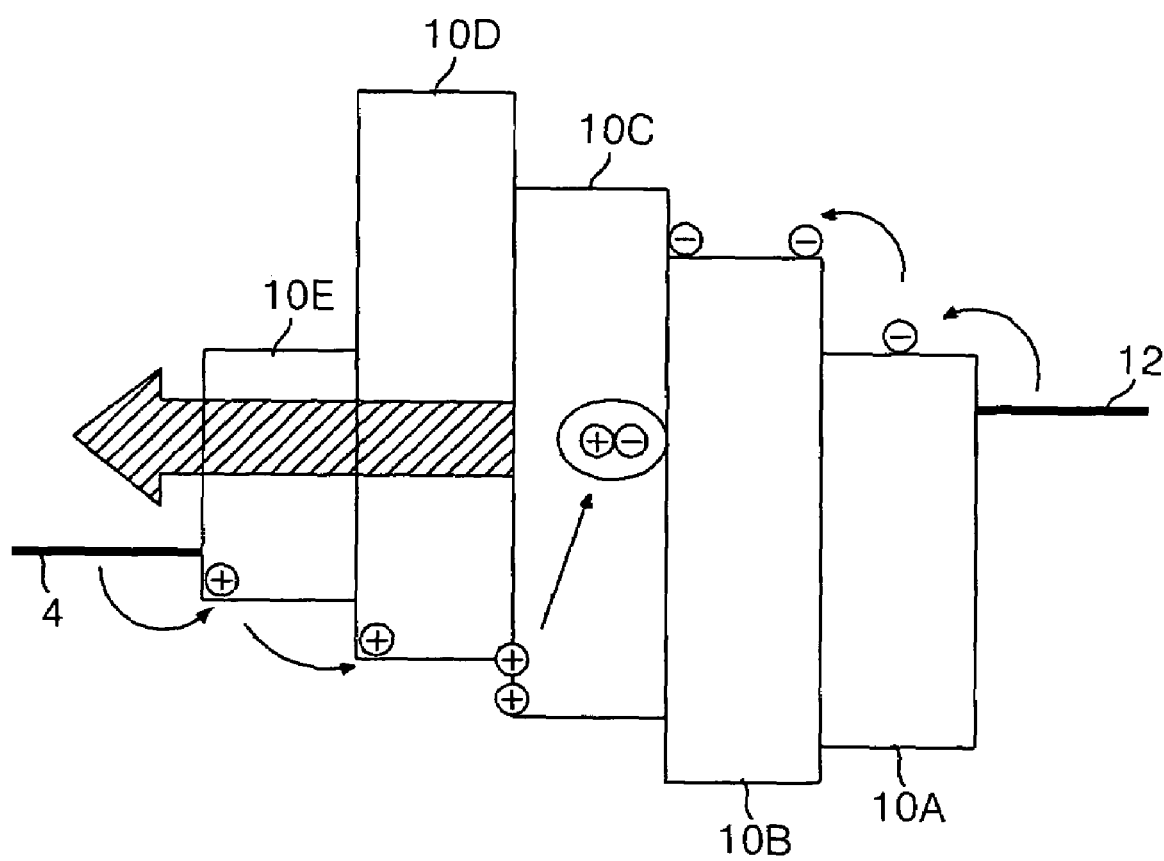
FIG. 2 is a diagram illustrating a light-emitting principle of the EL device shown in FIG. 1.
Figure 3:
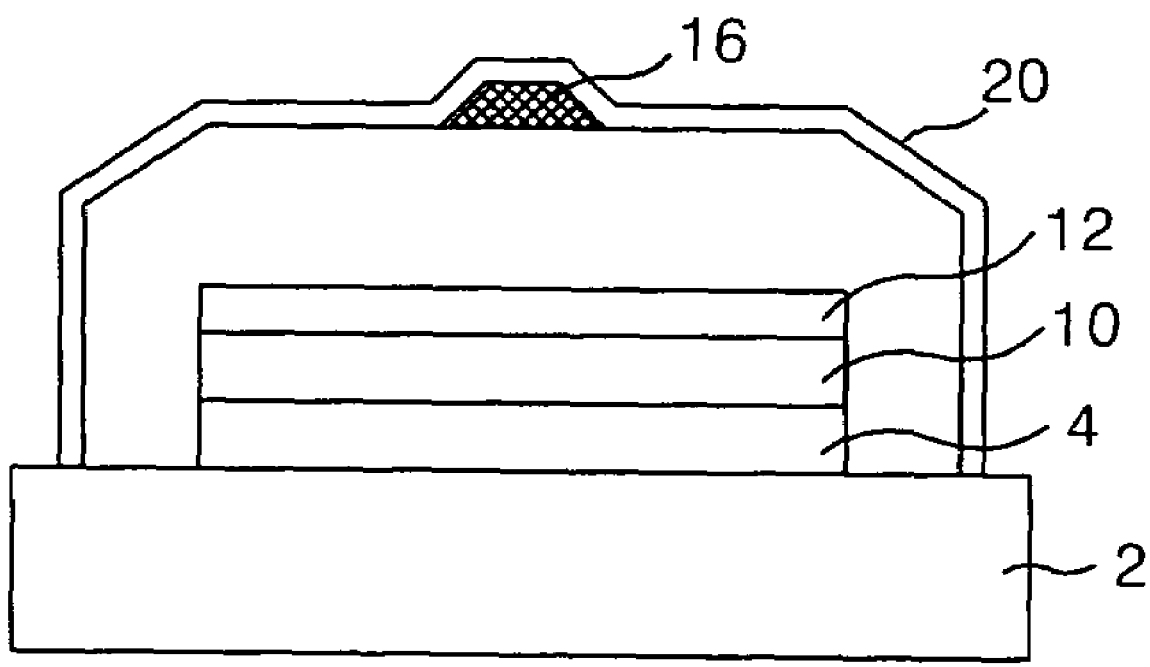
FIG. 3 is a sectional view of an encapsulated organic EL layer, in accordance with the background art.
Figure 4:
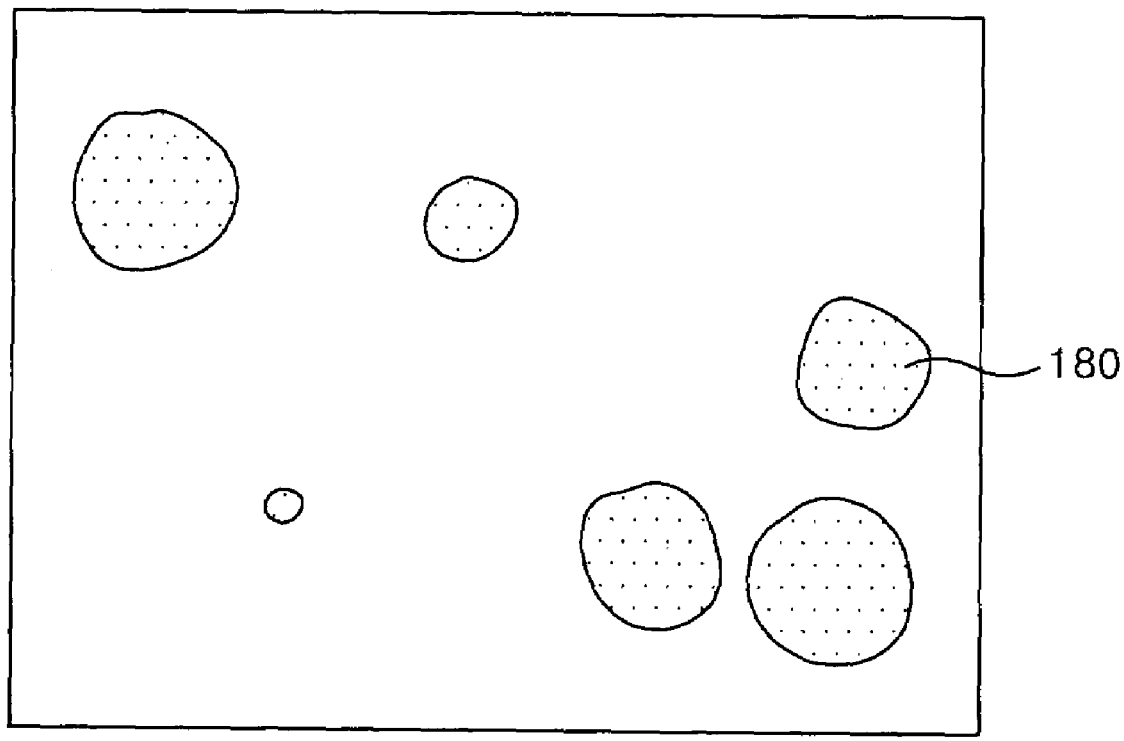
FIG. 4 illustrates a poor picture quality of the organic EL device, in accordance with the background art.
Figure 5:
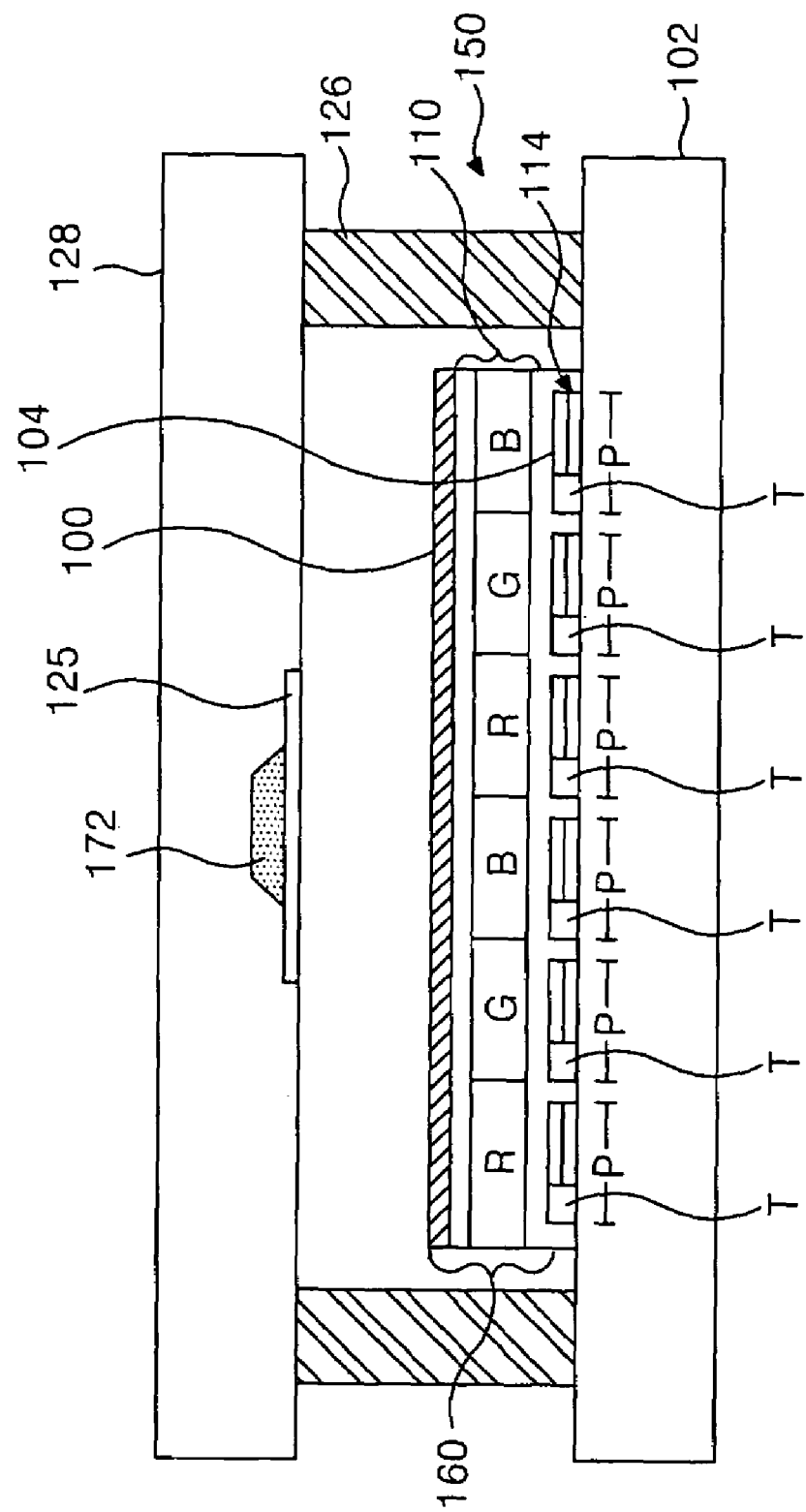
FIG. 5 is a sectional view of an organic EL device, according to an embodiment of the present invention.

FIG. 5 illustrates a sectional view of an organic EL device, according to an embodiment of the present invention. The organic EL device shown in FIG. 5 includes an organic EL array 150 having a thin film transistor (TFT) array portion 114 formed on the upper part of a transparent substrate 102, and an EL layer 160 formed on the thin film transistor (TFT) array portion 114. The EL layer 160 includes a first electrode 104 (or an anode), an organic EL layer 110, and a second electrode 100 (or a cathode). The EL layer 160 further includes a dielectric layer 115 (see FIG. 63).

The organic EL layer 110 displays a color of red (R), green (G) and blue (B), wherein special organic materials are patterned on their corresponding pixels in order to emit the red, green and blue colors.

To assist in preventing deterioration of the organic EL array 150 due to moisture and oxygen in the atmosphere, the substrate 102, having the organic EL array 150 formed thereon, and a packaging plate 128 are sealed together with a sealant 126 by an encapsulation process.

The packaging plate 128 serves to emit heat generated by light-emitting organic EL array 150. Further, the packaging plate 128 protects the organic EL array 150 from any external force, and keeps oxygen and moisture in the atmosphere away from the EL array 150.

An absorptive material or getter 172 is filled into an etched portion of the packaging plate 128. The absorptive material or getter 172 is fixed in place by a selective transparent film 125.

Figure 6:
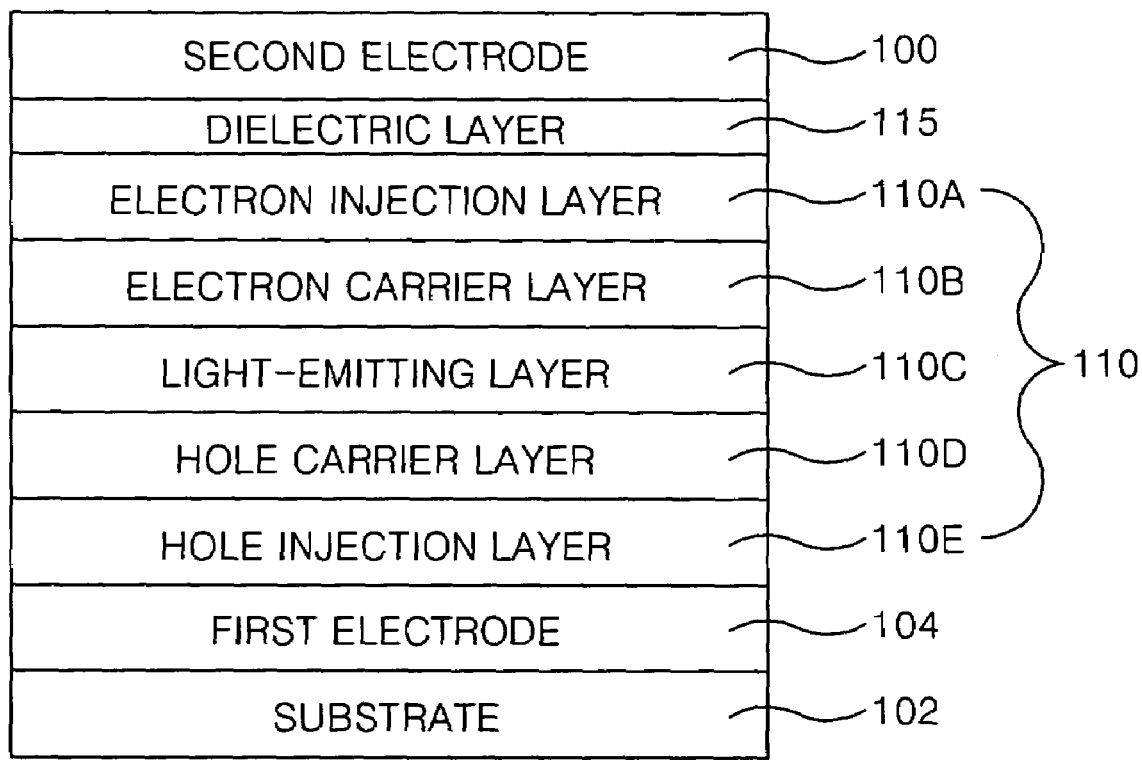
FIG. 6 is a detailed block diagram of a part of an organic EL device, according to an embodiment of the present invention.
Figure 7:
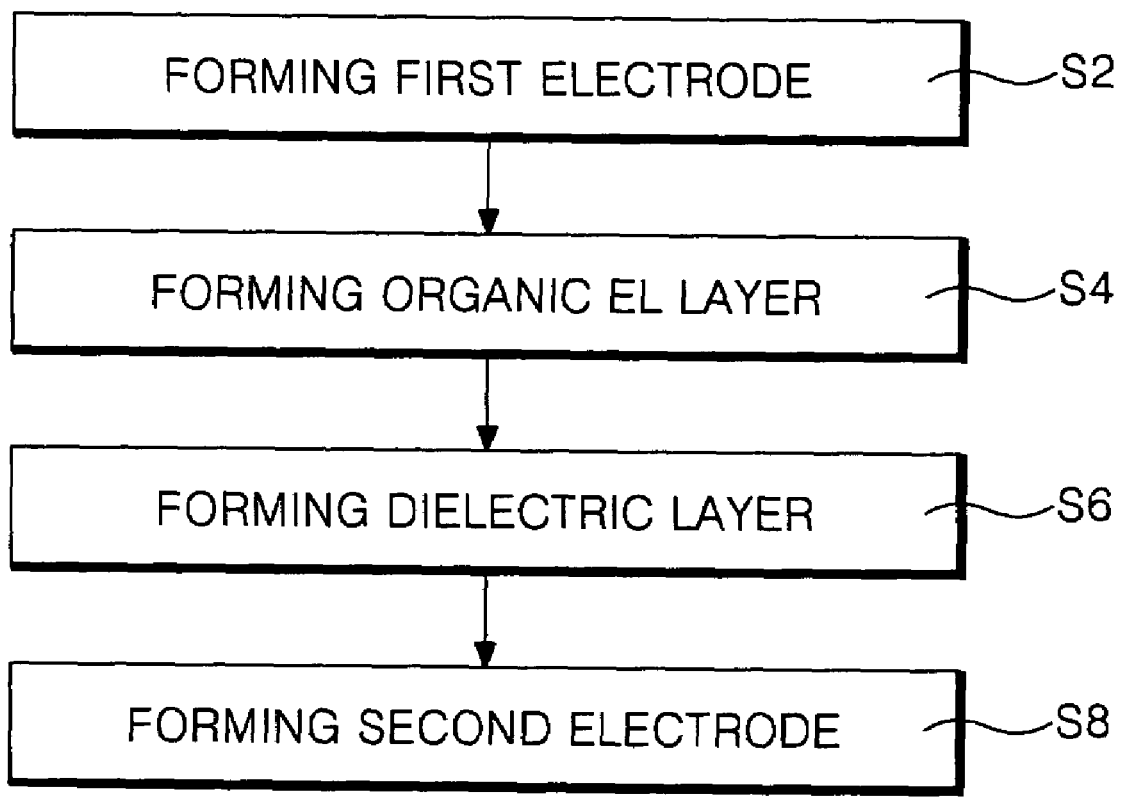
FIG. 7 is a flow chart illustrating a fabricating method of an organic EL device, according to an embodiment of the present invention.

FIG. 6 is a detailed block diagram of the EL layer 160 of an organic EL device shown in FIG. 5.

The EL layer 160 shown in FIG. 6 includes the organic electro-luminescence (EL) layer 110, formed between the first electrode 104 and the second electrode 100, and also includes a dielectric layer 115. The dielectric layer 115 includes an antioxidative material, and is located between the second electrode 100 and the organic EL layer 110. The organic EL layer 110 includes an electron injection layer 110A, an electron carrier layer 110B, a light-emitting layer 110C, a hole carrier layer 110D and a hole injection layer 110E.

The dielectric layer 115 is preferably formed of an antioxidative material having a mixture of 50~75% of an organic material and 25~50% of an metallic powder. The dielectric layer 115 functions to reduce the difference in surface energy between the organic EL layer 110 and the second electrode 100. This prevents the creation of an oxide film, and enhances an electrical property of the EL layer 160. Therefore, the electrons created in the second electrode 100 are easily moved into the organic EL layer 110. Overall, the prevention of any oxide film enhances the light-emitting efficiency and picture quality of the EL device.

In one embodiment, the dielectric layer 115 is a compound including an organic material, for instance, at least one of a salt system compound, a $CH_3COO$— compound, an aromatics amine system material, phenol derivatives and a phosphite system material. Such an organic compound is combined with a metallic powder having low work function. Therefore, the dielectric layer 115 has the characteristics of both an organic material and an inorganic material. As a result, the dielectric layer 115 has an excellent contact characteristic with the second electrode 100 of inorganic material, as well as an excellent contact characteristic with the organic EL layer 110.

Accordingly, the dielectric layer 115 is capable of preventing the concentration of moisture and oxygen (still existing after the encapsulation process) by reducing the abrupt difference between the surface energies of the organic EL layer 110 and the second electrode 100. Further, the dielectric layer 115 is capable of preventing the creation of any oxide film, since the dielectric layer 115 contains the antioxidative material, wherein the organic material and the metallic powder are mixed. Since the antioxidative material in the dielectric layer 115 possesses a hygroscopic property capable of absorbing a little amount of moisture, the dielectric layer 115 can absorb some of the moisture and oxygen concentrated on the second electrode 100, exposed in the atmosphere upon the formation thereof.

Further, since the dielectric layer 115 has characteristics of both an organic material and an inorganic material, the dielectric layer 115 will easily inject the electrons into the organic EL layer 110 by lowering an electron injection barrier between the second electrode 100 and the organic EL layer 110. In other words, the dielectric layer 115 will reduce a band gap energy level which must be exceeded to inject the electrons into the organic EL layer 110.

Accordingly, in comparison with the conventional organic EL device, a light-emitting efficiency of the inventive EL device is increased. Further, a picture quality of the inventive EL device is enhanced by preventing the oxide film from being created, and making it easy to inject the electrons.

According to the present invention, it is preferable to form the thickness of the dielectric layer 115 below 10~80 Å. In some instances, if the dielectric layer 115 is formed over 10~80 Å in thickness, the dielectric layer 115 can function as a resistor, like a conventional oxide film, and restrict the movement of the electrons. Whereas, if the dielectric layer 115 is formed below 10~80 Å in the thickness, the dielectric layer 115 will enable the electrons to easily move by a tunneling effect.

In operation, if a predetermined voltage is applied between the first electrode 104 and the second electrode 100 of the EL layer 160 having such a configuration, the electron generated from the second electrode 100 moves to the light-emitting layer 110C through the dielectric layer 115, the electron injection layer 110A and the electron carrier layer 110B. Meanwhile, the hole generated from the first electrode 104 moves to the light-emitting layer 110C through the hole injection layer 110E and the hole carrier layer 110D. Accordingly, light is emitted from the light-emitting layer 110C by a collision and a recombination of the electrons and the holes. As a result, a picture can be displayed by the emission of the light through the first electrode 104.

In this connection, the hole injection layer 110E serves to adjust the concentration of the holes, and the hole carrier layer 110D serves to adjust the speed of the holes, so that the holes are easily injected to the light-emitting layer 110C. Conversely, the electron injection layer 111A and the electron carrier layer 110B serve to adjust the concentration and the speed of the electrons, so that the electrons are easily injected to the light-emitting layer 110C.

Hereinafter, a fabricating method of the EL layer of the EL device, according to the invention, will be described using a flow chart, shown in FIG. 7.

First of all, in step S2, a metallic transparent conductive material is formed on the substrate 102 having the thin film transistor (TFT) array 114 thereon. The metallic transparent conductive material can be formed on the substrate 102 by a depositing method, such as a sputtering method using an Ar plasma, a nozzle coating method, a spin coating method, or a roll printing method. After the metallic transparent conductive material is applied, it is patterned by a photolithographic process and/or an etching process, to form the first electrode 104.

The thin film transistor (TFT) array 114 includes at least one of an Amorphous Silicon (a-Si) and a Poly Silicon (Poly-Si). The material of the first electrode includes a transparent conductive material, such as an Indium Tin Oxide (ITO), a Tin Oxide (TO) and an Indium Zinc Oxide (IZO). Additionally, Au, Pt and Cu may be added, to the first electrode 104.

In step S4, in the case of a low molecular compound, the hole carrier layer 110D, the hole injection layer 110E, the light-emitting layer 108C, the electron carrier layer 110B, and the electron injection layer 110A are sequentially formed on the substrate 102, having the fist electrode 104, by using a vacuum depositing method. While, in the case a high molecular compound, the layers 110A–110E may be formed on the substrate 102 by using a spin coating method or an inkjet printing method. Accordingly, the EL layer 110 is formed on the substrate 102 having the first electrode 104 thereon.

The hole injection layer 110E is formed using mainly Copper(II) Phthalocyanine, and is preferably about 10~30 nm thick. The hole carrier layer 110D is formed using mainly N,N-di(naphthalene-1-yl)-N,N'-diphenylbenzidine (NPD), and is preferably about 30~60 nm thick. As occasion demands, the light-emitting layer 110C uses a light-emitting substance independently, or one doping on a host material. Particularly, in the case of the green (G) light, among red (R), green (G) and blue (B) lights, the light-emitting layer 110C is formed by doping N-methylquinacridone (MQD) on a host, such as tris(8-hydroxyquinolate) aluminum (Alq3). In this case, the light-emitting layer 110C is preferably about 30~60 nm thick. Moreover, in the case of using a light-emitting substance independently, the light-emitting layer 110C is formed by doping mainly Alq3 to emit the green (G) light.

The electron carrier layer 110B is formed using metal-complex compounds like Alq3, preferably about 20~50 nm thick. The electron injection layer 110A is formed using alkali metallic derivatives, and is preferably about 30~60 nm thick.

In step S6, a compound is formed on the substrate 102 having the organic EL layer 110 thereon. The compound has a configuration coupled with an organic material, for instance, at least one of a salt system compound, a $CH_3COO-$ compound, an aromatics amine system material, a phenol derivative and a phosphite system-material, and a metallic powder of about 20~25%, with a low work function. The aromatic amine system material includes phenyl-α-naphthyl amine, 4,4'-dioxyl diphenylamine, N,N'-diphenyl-p-phenylenediamine, N-phenyl-N'-cyclohexyl-p-phenyleneamine, N,N'-di-o-tri-ethylenediamine and alkylationdiphenylamine. The phenol derivatives include hydroquinone, monobenzylethyl, 2,6-di-t-butylphenyl, 2,6-di-t-p-cresol, 2,4,6-tri-t-butylphenyl, 4,4'-bis-t-butylphenyl- and 4,4'-bis(3.5-di-t-butylphenyl). The phosphite system material includes triphenylphosphite and tonylphenylphosphite. The salt system material includes 0,0-Diethy thiophosphite potassium salt, 0,0-Diethyl thiophosphate lithium salt, lithium thiophosphate. Finally, the metallic powder, with the low work function, includes Al, Li, Ca, Mg and Ba.

In step S8, the metallic material, with the low work function, is deposited on the substrate 102 with the dielectric layer 115. The metallic material may be deposited using one of the sputtering method, the nozzle coating method, the spin coating method, and the roll printing method, to thereby form the second electrode 100. Al, Li, Ca, Mg and Ba may be used to form the metallic powder having a low work function.

As mentioned above, the organic EL layer and the fabricating method thereof, according the embodiments of the present invention, forms the dielectric layer 115 to have the characteristic of both an organic material and an inorganic material by containing the antioxidative material between the second electrode 100 and the organic EL layer 110.

Such a dielectric layer 115 is formed between the organic EL layer 110 and the second electrode 100. By this arrangement, the organic EL layer 110 and the second electrode 100, which have very different surface energies, are separated. Further, moisture and oxygen is absorbed. Accordingly, the dielectric layer 115 is capable of preventing concentration of moisture and oxygen by reducing the difference of the surface energy between the organic EL layer 110 and the second electrode 100, as compared with the related art. Moreover, the dielectric EL layer 110, containing antioxidative material, is capable of preventing the creation of an oxide film by absorbing moisture and oxygen, even if moisture and oxygen concentrated on the second electrode 100.

Further, since the dielectric layer 115 has the characteristic of both organic material and inorganic material, it will easily inject electrons into the organic EL layer 110 by reducing a band gap energy between the second electrode 100 and the organic EL layer 110.

Accordingly, in comparison with the conventional organic EL device, a light-emitting efficiency of the EL device is increased. Further, a picture quality is enhanced by preventing the oxide film from being created, and by making it easy to inject the electrons.

In addition, the dielectric layer 115, having the antioxidative material, may be used on an upper portion light-emitting type organic EL device, and a passive organic EL device, as well as a lower portion light-emitting type organic EL device, as shown in FIG. 5.

The organic EL layer and the fabricating method thereof, according to the present invention, includes the antioxidative material between the second electrode and the organic EL layer to form the dielectric layer having the characteristic of both an organic material and an inorganic material. Such a dielectric layer reduces the difference of the surface energy between the organic EL layer and the second electrode, and enhances an electrical property of the EL layer. Since electrons generated from the second electrode can be easily injected, a picture quality of the EL device is enhanced, and the light-emitting efficiency is increased.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An organic electro-luminescence (EL) device, comprising:
    a first electrode formed on a substrate;
    a second electrode formed to overlap said first electrode;
    an organic EL layer located between said first electrode and said second electrode; and
    a dielectric layer formed between said second electrode and said organic EL layer, wherein said dielectric layer contains an antioxidative material including a mixture of about 50~75% of an organic material and about 25~50% of metallic powder so that the dielectric layer reduces difference in surface energy between the organic EL layer and the second electrode, thereby preventing creation of an oxide film and enhancing an electrical property of the organic EL layer.

2. The organic EL device according to claim 1, wherein said organic material is at least one of a salt system compound, a $CH_3COO-$ compound, an aromatics amine system material, phenol derivatives and a phosphite system material.

3. The organic EL device according to claim 1, wherein said metallic powder is a metal with a low work function.

4. The organic EL device according to claim 1, wherein said metallic powder is at least one of Al, Li, Ca, Mg and Ba.

5. The organic EL device according to claim 1, wherein said dielectric layer has a thickness of approximately 10~80 Å.

6. The organic EL device according to claim 1, wherein said organic EL layer includes:
a hole injection layer formed on said first electrode;
a hole carrier layer formed on said hole injection layer;
a light-emitting layer formed on said hole carrier layer;
an electron carrier layer formed on said light-emitting layer; and
an electron injection layer formed on said electron carrier layer.

7. The organic EL device according to claim 1, wherein said first electrode is formed of at least one of an Indium Tin Oxide (ITO), a Tin Oxide (TO) and an Indium Zinc Oxide (IZO).

8. The organic EL device according to claim 1, wherein the antioxidative material includes material to prevent deterioration of the organic EL layer due to moisture or oxygen or both.

9. A flat panel display comprising:
a transparent substrate; and
an organic electro-luminescence (EL) array formed on said transparent substrate, wherein said organic electro-luminescence (EL) array includes:
a first electrode formed on said transparent substrate;
a second electrode formed to overlap said first electrode;
an organic EL layer located between said first electrode and said second electrode; and
a dielectric layer formed between said second electrode and said organic EL layer, wherein said dielectric layer contains an antioxidative material including a mixture of about 50~75% of an organic material and about 25~50% of the metallic powder so that the dielectric layer reduces difference in surface energy between the organic EL layer and the second electrode, thereby preventing creation of an oxide film and enhancing an electrical property of the organic EL layer.

10. The flat panel display according to claim 9, wherein said organic EL array includes a thin film transistor array portion.

11. The flat panel display according to claim 9, wherein said organic material is at least one of a salt system compound, a $CH_3COO-$ compound, an aromatics amine system material, phenol derivatives and a phosphite system material.

12. The flat panel display according to claim 9, wherein said metallic powder is at least one of Al, Li, Ca, Mg and Ba.

13. The flat panel display according to claim 9, wherein said dielectric layer has a thickness of approximately 10~80 Å.

14. The organic EL device according to claim 9, wherein said organic EL layer includes:
a hole injection layer formed on said first electrode;
a hole carrier layer formed on said hole injection layer;
a light-emitting layer formed on said hole carrier layer;
an electron carrier layer formed on said light-emitting layer; and
an electron injection layer formed on said electron carrier layer.

15. The organic EL device according to claim 9, wherein said first electrode is formed of at least one of an Indium Tin Oxide (ITO), a Tin Oxide (TO) and an Indium Zinc Oxide (IZO).

16. The flat panel display according to claim 9, wherein the antioxidative material includes material to prevent deterioration of the organic EL layer due to moisture or oxygen or both.

17. The flat panel display according to claim 9, further comprising:
a packaging plate formed above the second electrode; and
a sealant formed between the transparent substrate and the packaging plate to encapsulate the organic EL array.

18. The flat panel display according to claim 9, further comprising:
a getter formed in an etched portion of the packaging plate; and
a transparent film arranged in the etched portion of the packaging plate configured to fix the getter in place.

19. A method of fabricating an organic electro-luminescence (EL) device, comprising:
forming a first electrode on a substrate;
forming an organic EL layer on the first electrode;
forming a dielectric layer on the organic EL layer; and
forming a second electrode on the dielectric layer, wherein the dielectric layer contains an antioxidative material including a mixture of about 50~75% of an organic material and about 25~50% of metallic powder so that the dielectric layer reduces difference in surface energy between the organic EL layer and the second electrode, thereby preventing creation of an oxide film and enhancing an electrical property of the organic EL layer.

20. The method of claim 19, wherein the organic material is at least one of a salt system compound, a $CH_3COO-$ compound, an aromatics amine system material, phenol derivatives and a phosphite system material.

21. The method of claim 19, wherein the metallic powder is at least one of Al, Li, Ca, Mg and Ba.

22. The method of claim 19, wherein said step of forming the organic EL layer includes:
forming a hole injection layer on the first electrode;
forming a hole carrier layer on the hole injection layer;
forming a light-emitting layer on the hole carrier layer;
forming an electron carrier layer on the light-emitting layer; and
forming an electron injection layer on the electron carrier layer.

23. The method of claim 19, wherein the dielectric layer has a thickness of approximately 10~80 Å.

24. The method of claim 19, wherein the first electrode is formed of at least one of an Indium Tin Oxide (ITO), a Tin Oxide (TO) and an Indium Zinc Oxide (IZO).

25. The method of claim 19, wherein the antioxidative material includes material to prevent deterioration of the organic EL layer due to moisture or oxygen or both.

* * * * *